US009720145B2

(12) United States Patent
Kanskar

(10) Patent No.: US 9,720,145 B2
(45) Date of Patent: Aug. 1, 2017

(54) HIGH BRIGHTNESS MULTIJUNCTION DIODE STACKING

(71) Applicant: nLIGHT Photonics Corporation, Vancouver, WA (US)

(72) Inventor: Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 3 days.

(21) Appl. No.: 14/641,093

(22) Filed: Mar. 6, 2015

(65) Prior Publication Data
US 2015/0255960 A1 Sep. 10, 2015

Related U.S. Application Data

(60) Provisional application No. 61/949,224, filed on Mar. 6, 2014.

(51) Int. Cl.
*G02B 27/30* (2006.01)
*G02B 5/09* (2006.01)
(Continued)

(52) U.S. Cl.
CPC .................. *G02B 5/09* (2013.01); *G02B 5/10* (2013.01); *G02B 6/4204* (2013.01);
(Continued)

(58) Field of Classification Search
CPC . G02B 27/30; G02B 5/10; G02B 5/09; G02B 6/4204; G02B 6/4296; H01S 5/4062; H01S 5/4043; H01S 5/02248; H01S 5/02284; H01S 5/3054; H01S 5/4031; H01S 3/08059
(Continued)

(56) References Cited

U.S. PATENT DOCUMENTS 3,622,906 A 11/1971 Nyul
3,827,059 A 7/1974 Rambauske
(Continued)

FOREIGN PATENT DOCUMENTS

CN 1829015 9/2006
CN 1975507 6/2007
(Continued)

OTHER PUBLICATIONS

Notice of Allowance for corresponding U.S. Appl. No. 13/328,877, mailed Sep. 5, 2014.
(Continued)

*Primary Examiner* — Scott J Sugarman
*Assistant Examiner* — Mustak Choudhury
(74) *Attorney, Agent, or Firm* — Klarquist Sparkman, LLP

(57) ABSTRACT

An apparatus includes at least one multijunction diode laser situated to emit a plurality of beams along respective mutually parallel propagation axes, each beam having an associated mutually parallel slow axes and associated collinear fast axes, a fast axis collimator situated to receive and collimate the plurality of beams along the corresponding fast axes so as to produce corresponding fast axis collimated beams that propagate along associated non-parallel axes, and a reflector situated to receive the plurality of fast axis collimated beams and to reflect the beams so that the reflected fast axis collimated beams propagate along substantially parallel axes.

20 Claims, 6 Drawing Sheets

(51) Int. Cl.
*G02B 5/10* (2006.01)
*G02B 6/42* (2006.01)
*H01S 3/08* (2006.01)
*H01S 5/022* (2006.01)
*H01S 5/30* (2006.01)
*H01S 5/40* (2006.01)

(52) U.S. Cl.
CPC .......... *G02B 6/4296* (2013.01); *G02B 27/30* (2013.01); *H01S 5/4043* (2013.01); *H01S 5/4062* (2013.01); *H01S 3/08059* (2013.01); *H01S 5/02248* (2013.01); *H01S 5/02284* (2013.01); *H01S 5/3054* (2013.01); *H01S 5/4031* (2013.01)

(58) Field of Classification Search
USPC ....... 359/641, 618, 625, 619, 621, 719, 372, 359/385; 372/50.12, 99, 101, 107; 385/33, 146
See application file for complete search history.

(56) References Cited

U.S. PATENT DOCUMENTS

| | | | |
|---|---|---|---|
| 4,550,333 A | 10/1985 | Ridder et al. |
| 4,689,482 A | 8/1987 | Horikawa et al. |
| 4,716,568 A | 12/1987 | Scifres et al. |
| 4,719,631 A | 1/1988 | Conaway |
| 4,828,357 A | 5/1989 | Arata et al. |
| 5,048,911 A | 9/1991 | Sang et al. |
| 5,077,750 A | 12/1991 | Pocholle et al. |
| 5,105,430 A | 4/1992 | Mundinger et al. |
| 5,168,401 A | 12/1992 | Endriz |
| 5,305,344 A | 4/1994 | Patel |
| 5,319,528 A | 6/1994 | Raven |
| 5,515,391 A | 5/1996 | Endriz |
| 5,610,930 A | 3/1997 | Macomber et al. |
| 5,668,822 A | 9/1997 | Tada |
| 5,764,675 A | 6/1998 | Juhala |
| 5,825,551 A | 10/1998 | Clarkson et al. |
| 5,828,683 A | 10/1998 | Freitas |
| 5,887,096 A | 3/1999 | Du et al. |
| 5,898,211 A | 4/1999 | Marshall et al. |
| 5,909,458 A | 6/1999 | Freitas et al. |
| 5,986,794 A | 11/1999 | Krause et al. |
| 5,987,043 A | 11/1999 | Brown et al. |
| 6,028,722 A | 2/2000 | Lang |
| 6,044,096 A | 3/2000 | Wolak et al. |
| 6,057,871 A | 5/2000 | Peterson |
| 6,075,912 A | 6/2000 | Goodman |
| 6,115,185 A | 9/2000 | Du et al. |
| 6,124,973 A | 9/2000 | Du |
| 6,229,831 B1 | 5/2001 | Nightingale et al. |
| 6,240,116 B1 | 5/2001 | Lang et al. |
| 6,266,359 B1 | 7/2001 | Taheri et al. |
| 6,324,320 B1 | 11/2001 | Goodman |
| 6,327,285 B1 | 12/2001 | Wang |
| 6,377,410 B1 | 4/2002 | Wang et al. |
| 6,462,883 B1 | 10/2002 | Wang et al. |
| 6,552,853 B2 | 4/2003 | Goodman |
| 6,556,352 B2 | 4/2003 | Wang et al. |
| 6,636,538 B1 | 10/2003 | Stephens |
| 6,673,699 B2 | 1/2004 | Hubbard et al. |
| 6,680,800 B1 | 1/2004 | Schreiber et al. |
| 6,683,727 B1 | 1/2004 | Goring et al. |
| 6,700,709 B1 | 3/2004 | Fermann |
| 6,710,926 B2 | 3/2004 | Beach et al. |
| 6,765,725 B1 | 7/2004 | Fermann et al. |
| 6,778,732 B1 | 8/2004 | Fermann |
| 6,898,222 B2 | 5/2005 | Hennig et al. |
| 6,975,659 B2 | 12/2005 | Nagano et al. |
| 7,420,996 B2 | 9/2008 | Schulte et al. |
| 7,436,868 B2 | 10/2008 | Schulte et al. |
| 7,443,895 B2 | 10/2008 | Schulte et al. |
| 7,586,963 B2 | 9/2009 | Schulte et al. |
| 7,733,932 B2 | 6/2010 | Faybishenko |
| 7,751,458 B2 | 7/2010 | Regaard et al. |
| 7,764,723 B2 | 7/2010 | Ovtchinnikov et al. |
| 7,830,608 B2 | 11/2010 | Hu |
| 7,848,372 B2 | 12/2010 | Schulte et al. |
| 7,947,517 B2 | 5/2011 | Hisa |
| 8,000,360 B2 | 8/2011 | Faybishenko |
| 8,066,389 B2 | 11/2011 | Silverstein et al. |
| 8,126,028 B2 | 2/2012 | Clifford, Jr. |
| 8,339,598 B2 | 12/2012 | Ban et al. |
| 8,427,749 B2 | 4/2013 | Du et al. |
| 8,432,945 B2 | 4/2013 | Faybishenko |
| 8,437,086 B2 | 5/2013 | Du et al. |
| 8,488,245 B1 | 7/2013 | Chann |
| 8,508,729 B2 | 8/2013 | Ban et al. |
| 8,553,221 B2 | 10/2013 | Volodin et al. |
| 8,599,485 B1 | 12/2013 | Cobb |
| 8,654,326 B2 | 2/2014 | Volodin et al. |
| 8,830,587 B2 | 9/2014 | Bhatia et al. |
| 8,842,369 B2 | 9/2014 | Li |
| 8,861,082 B2 | 10/2014 | Cobb |
| 8,873,134 B2 | 10/2014 | Price et al. |
| 8,891,579 B1 * | 11/2014 | Price ................... H01S 5/02292 372/107 |
| 8,942,521 B2 | 1/2015 | Song et al. |
| 9,005,262 B2 | 4/2015 | Liu et al. |
| 9,455,552 B1 | 9/2016 | Price et al. |
| 2004/0114027 A1 | 6/2004 | Frith |
| 2006/0165144 A1 | 7/2006 | Mikhailov et al. |
| 2006/0280209 A1 | 12/2006 | Treusch |
| 2007/0116071 A1 | 5/2007 | Schulte et al. |
| 2007/0116077 A1 | 5/2007 | Farmer et al. |
| 2007/0217467 A1 | 9/2007 | DeFranza et al. |
| 2007/0217468 A1 | 9/2007 | DeFranza et al. |
| 2007/0217469 A1 | 9/2007 | DeFranza et al. |
| 2007/0217470 A1 | 9/2007 | DeFranza et al. |
| 2007/0217471 A1 | 9/2007 | DeFranza et al. |
| 2007/0268572 A1 | 11/2007 | Hu |
| 2007/0268945 A1 | 11/2007 | Schulte et al. |
| 2007/0268946 A1 | 11/2007 | Schulte et al. |
| 2007/0268947 A1 | 11/2007 | Schulte et al. |
| 2009/0323752 A1 | 12/2009 | Chuyanov et al. |
| 2010/0158060 A1 | 6/2010 | Faybishenko |
| 2010/0226405 A1 | 9/2010 | Chuyanov et al. |
| 2013/0148684 A1 | 6/2013 | Guo et al. |
| 2013/0162956 A1 | 6/2013 | Okuda |
| 2013/0194801 A1 | 8/2013 | Wolf et al. |
| 2014/0036375 A1 | 2/2014 | Chann et al. |
| 2016/0181764 A1 | 6/2016 | Kanskar et al. |

FOREIGN PATENT DOCUMENTS

| | | |
|---|---|---|
| CN | 101141051 | 3/2008 |
| CN | 101144909 | 3/2008 |
| CN | 201113224 | 9/2008 |
| CN | 201515142 | 6/2010 |
| CN | 102074896 | 5/2011 |
| CN | 102437509 | 5/2012 |
| CN | 202548385 | 11/2012 |
| CN | 202720390 | 2/2013 |
| CN | 203071399 | 7/2013 |
| CN | 103368066 | 10/2013 |
| CN | 103401136 | 11/2013 |
| RU | 2010143026 | 4/2012 |
| WO | WO 2005059626 | 6/2005 |

OTHER PUBLICATIONS

Office Action for corresponding U.S. Appl. No. 13/328,877, mailed Apr. 14, 2014.
Edwin, "Stripe Stacker for Use with Laser Diode Bars," Optics Letters, 20:222-224 (Jan. 15, 1995).
International Search Report and Written Opinion for International Application No. PCT/US2015/019288, mailed Jun. 10, 2015.

* cited by examiner

HIGH BRIGHTNESS MULTIJUNCTION DIODE STACKING

CROSS REFERENCE TO RELATED APPLICATION

This application claims the benefit of U.S. Provisional Application No. 61/949,224, filed on Mar. 6, 2014, which is hereby incorporated by reference in its entirety.

FIELD

The disclosure pertains to high brightness laser diodes.

BACKGROUND

Multijunction diode lasers have been demonstrated to significantly increase the output power per diode chip in a high brightness diode laser package. However, due to thermal and optical problems and constraints, these devices have typically been limited to use in quasi continuous-wave diode laser arrays for pumping solid-state lasers. With recent developments which can improve the efficiency of multijunction devices, such devices may now be used in continuous-wave operation, offering the potential for a vast array of applications. Conventional techniques for combining beams produced by multijunction diode lasers and arrays of multijunction diode lasers tend to be inefficient and improved approaches are needed.

SUMMARY

According to one aspect, an apparatus includes at least one multijunction diode laser situated to emit a plurality of beams along respective mutually parallel propagation axes, each beam having an associated mutually parallel slow axes and associated collinear fast axes, a fast axis collimator situated to receive and collimate the plurality of beams along the corresponding fast axes so as to produce corresponding fast axis collimated beams that propagate along associated non-parallel axes, and a reflector situated to receive the plurality of fast axis collimated beams and to reflect the beams so that the reflected fast axis collimated beams propagate along substantially parallel axes.

According to another aspect, a method of directing beams of a multijunction diode laser includes emitting a plurality of beams from a multijunction laser diode such that principal axes of the emitted beams are parallel, each beam associated with a slow axis that is parallel and spaced apart from slow axes associated with other emitted beams and fast axes associated with the emitted beams are collinear, collimating each of the plurality of beams along respective fast axes so that the collimated beams propagate at different angles with respect to the parallel principal axes, and reflecting the fast axis collimated beams with a reflector so that the reflected beams propagate along substantially parallel axes.

According to a further aspect, an apparatus includes at least one multijunction semiconductor laser situated on a thermally conductive mounting block, the laser including a plurality of active junctions monolithically stacked one above the other and spaced apart from each other in a semiconductor growth direction along a common injection path, each active junction including a corresponding emitting facet situated to emit a laser beam having with a fast axis and slow axis mutually orthogonal to each other and to a beam emission direction, each beam emission direction being parallel to each other beam emission direction, a fast axis collimator situated to receive and collimate the beams with respect to the fast axis of the beams and to provide the beams with a pointing difference, a slow axis collimator situated to receive and collimate the beams with respect to the slow axis of the beams, and a reflective pointing corrector situated to receive the fast axis collimated beams which have propagated at least a distance such that a substantial amount of power of the beams no longer overlaps and situated to reflect the beams such that the principal axes of the reflected beams are parallel to each other.

The foregoing and other objects, features, and advantages will become more apparent from the following detailed description, which proceeds with reference to the accompanying figures.

DETAILED DESCRIPTION

Figure 1:
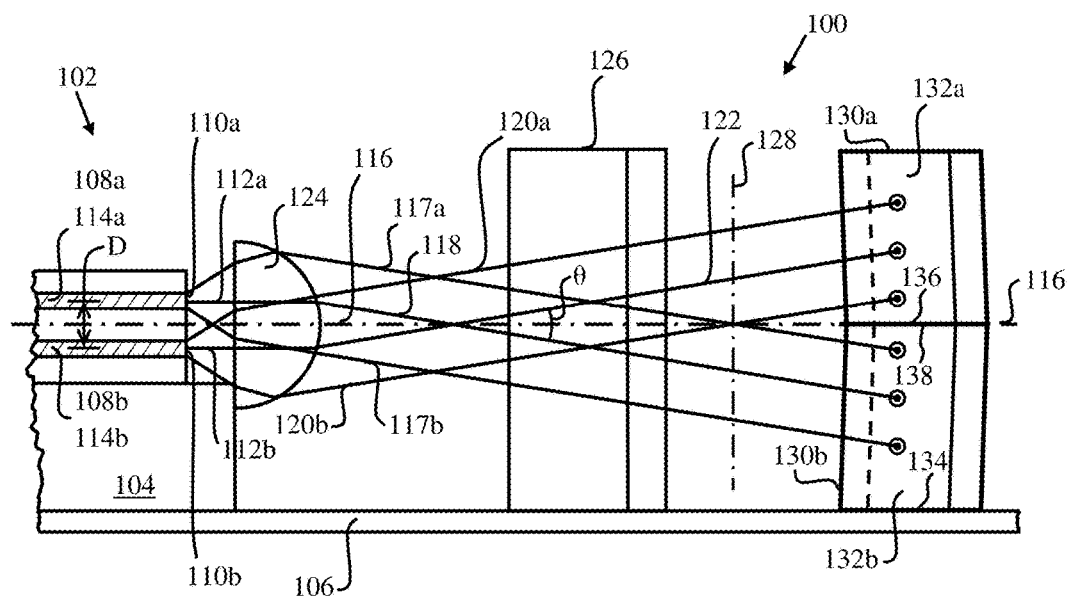
FIG. 1 is a schematic of a side view of a multijunction diode laser apparatus.

As used in this application and in the claims, the singular forms "a," "an," and "the" include the plural forms unless the context clearly dictates otherwise. Additionally, the term "includes" means "comprises." Further, the term "coupled" or does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

As used herein, optical radiation refers to electromagnetic radiation at wavelengths of between about 100 nm and 10 µm, and typically between about 500 nm and 2 µm. Examples based on available laser diode sources generally are associated with wavelengths of between about 800 nm and 1000 nm. In some examples, propagating optical radiation is referred to as one or more beams having diameters, asymmetric fast and slow axes, beam cross-sectional areas, and beam divergences that can depend on beam wavelength, beam fast and slow axes, and the optical systems used for beam shaping. For convenience, optical radiation is referred to as light in some examples, and need not be at visible wavelengths. For diode lasers and active junctions, slow axes are typically associated with the longer dimension of an emitter aperture. A longer dimension typically allows more modes and a larger spot, resulting in poorer beam parameter product and a slower divergence of emitted light. Conversely, fast axes are typically associated the shorter dimension of the emitter aperture. The shorter dimension confines light to have fewer modes and a smaller spot, resulting improved beam parameter product and a faster emission divergence.

As used herein, numerical aperture (NA) refers to a largest angle of incidence with respect to a propagation axis defined by an optical waveguide for which propagating optical radiation is substantially confined or by propagation through free space in vacuum, air, or other gases. In optical fibers, fiber cores and fiber claddings can have associated NAs, typically defined by refractive index differences between a core and cladding layer, or adjacent cladding layers, respectively. Free space optical beams as discussed above can also be referred to as having a beam NA which is associated with a beam angular radius. The term brightness is used herein to refer to optical beam power per unit area per solid angle. In some examples, optical beam power is provided with one or more laser diodes, including multijunction laser diodes, that produce beams with solid angles proportional to beam wavelength and beam area. Selection of beam area and beam solid angle can produce pump beams that couple selected pump beam powers into one or more core or cladding layers of double, triple, or other multi-clad optical fibers.

A representative multijunction diode laser apparatus 100 as shown in FIG. 1 includes a multijunction diode laser 102 mounted on a thermally conductive base 104 which is secured to a thermally conductive housing 106. The multijunction laser 102, shown cross-sectionally for clarity, includes two active laser junctions 108a, 108b each having associated output coupling front facets 110a, 110b from which corresponding diode laser beams 112a, 112b are emitted during laser operation. Highly reflective rear facets (not shown) are oppositely disposed from the front facets 110 so as to form corresponding resonant cavities 114a, 114b from which the beams 112 are generated. The distance between opposite facets generally defines a resonator length and can be on the order of mm. The active junctions 108 are offset from each other by a finite distance D generally centered about a central emission axis 116 so as to form a finite gap between junctions 108. The thickness of the cavities 114, i.e., in the direction of the offset D, is generally in the range of about one micron to several microns. Due to the relatively small size, the direction associated with the offset D is associated with a fast axis of the corresponding emitted beam 112. In some examples, active junctions can be gain-guided or index-guided.

In FIG. 1 the direction of the offset D is also on the order of microns and corresponds to a growth direction for the semiconductor laser 102. Different methods may be used for semiconductor growth as may be known in the art, including metal-organic chemical vapor deposition. Hence, the multiple laser junctions 108 and offsets between junctions can be formed monolithically by growing different semiconductor layers, such as with GaAs, AlGaAs, InP, and various combinations thereof, with varying degrees of doping and structural contours to achieve desired output beam wavelengths, powers, waveguiding, or other laser or apparatus parameters. Electrical current is injected into the laser 102 in the offset direction so as to power the active junctions 108 which are disposed electrically in series.

Emitted beam 112a includes portions directed along a pair of opposite marginal axes 117a, 117b and a principal axis 118 centered about a mid-plane of the resonant cavity 114a. Emitted beam 112b includes portions directed along a similar pair of opposite marginal axes 120a, 120b and a principal axis 122 centered about a mid-plane of the resonant cavity 114b. A fast axis collimation optic (FAC) 124 is disposed in the optical path of the emitted beams 112 and is situated to provide collimated outputs with respect to the fast axis of the beams, i.e., fast axis collimated beams. The effective focal length of the FAC optic 124 is typically relatively short, such as in the range of 150 to 400 µm. The offset of the beams 112 with respect to the fast axis provides the fast axis collimated beams with a pointing error θ with respect to the emission axis 116. FAC optic 124 is a plano-convex cylindrical lens as shown in FIG. 1, though it will be appreciated that bi-convex and other configurations are also suitable. Pointing error θ can be on the order of mrad depending on the effective focal length of the FAC optic 124 and offset D between emitting facets 110a, 110b. In some examples, pointing error θ is about 5 mrad.

The beams 112a, 112b have divergences that are less along a slow axis that is orthogonal to the fast axis than along the fast axis. The lesser divergences are generally associated with the larger width of the emitting facet 110 and resonant cavity 108 (i.e., a dimension into the plane of FIG. 1) which can be on the order of tens to hundreds of microns depending on the desired beam output characteristics. Because of the lesser divergences, a slow axis collimation (SAC) optic 126 is typically disposed in the optical path of the emitted beams 112 after the FAC optic 124. As shown in FIG. 1, the SAC optic 126 is a plano-convex cylindrical lens optic with an axis of curvature oriented orthogonally to the axis of curvature of the FAC optic 124, i.e., into the plane of FIG. 1. Because the SAC optic 126 collimates preferably only along the slow axis, the beams 112a, 112b typically are not redirected along the fast axis via propagation through the SAC optic 126. Similarly, the beams 112a, 112b are not redirected along the slow axes by propagation through FAC optic 124. For junctions 108 stacked one above the other with offset D in the fast axis direction, beams 112a, 112b generally do not have pointing error with respect to each other in the slow axis direction.

Collimated beams 112a, 112b propagating with respective fast axis pointing errors spatially diverge from one another along the fast axis until a plane 128 at which the beams 112a, 112b are spatially separated sufficiently that substantial portions of their respective beam powers are spatially separate. Collimated beams 112 typically have a substantially Gaussian beam profile along the fast axis resulting in a non-zero beam power that diminishes exponentially after a selected convention for beam width. In typical examples, beam widths and corresponding spatial separation for Gaussian beams are defined as a radial distance from a center position where beam intensity diminishes to $1/e^2$ of peak intensity, which corresponds to about 86% of the total beam power being within the selected radius. In other examples, the beam width is defined by a further reduction in intensity, such as $1/e^3$ corresponding to about 95% total beam power being within a selected radius that is about 22% larger than the $1/e^2$ radius, or $1/e^4$ corresponding to about 98% total beam power being within a selected radius that is about 42% larger than the $1/e^2$ radius. Less than about 0.05% total beam power lies outside a selected radius that is twice the $1/e^2$ radius for an ideal Gaussian beam.

Reflectors 130a, 130b are disposed along the propagation path of the beams 112 adjacent to plane 128, i.e., after the beams become spatially separated sufficiently along the beam fast axes such that the beams no longer substantially overlap. The reflectors 130a, 130b are situated with respective specular front surfaces 132a, 132b arranged at about 45° with respect to the incident transverse plane of the beams 112 in order to reflect the beams at about 90°, i.e., out of the plane of FIG. 1. Adjacent reflectors 130a, 130b are adjusted to slightly different angles to compensate the pointing error θ of the incident collimated beams 112a, 112b so that the collimated, reflected beams 112 or principal axes 118, 122 are parallel to each other and to the parallel slow axes of the beams 112a, 112b emitted from the front facets 110a, 110b. The reflected parallel beams can have some tolerance error associated with the degree to which the beams are parallel, however such tolerance is less than the divergence associated with the incident beams. For example, a 7 mrad divergence angle can be corrected to be within about ±2 mrad after reflection.

For example, a bottom surface 134 of lower reflector 130b can be secured with a UV curable epoxy to the housing 106, and aligned by rotating and tilting the reflector 130b prior to cure so that collimated beam 112a is reflected perpendicularly and substantially parallel to the emitter facet 110a or otherwise directed to a desired location on a focusing objective or coupling fiber (not shown). The bottom surface 136 of upper reflector 130a can then be secured with UV curable epoxy to a top surface 138 of lower reflector 130b and aligned by rotating and tilting the reflector 130a so that collimated beam 112b is reflected perpendicularly and parallel or substantially parallel to the reflected principal axis 118 of beam 112a.

The alignment of the reflector surfaces 132 for pointing correction of the beams 112 provides a small angular difference between the reflector surfaces 132. Collimated, reflected, and pointing-corrected beams 112 are then received by a focusing objective for subsequent coupling into an optical fiber. Thus, the multiple beams 112 from the monolithic set of multiple emitters 110 are reflected in a closely packed, etendue efficient manner using fewer optics per emitter than single junction emitter examples. In additional examples, the reflectors 130 are secured or formed together with a predetermined angular difference for correction of the pointing error θ. An assembly or singular reflector can then be aligned and secured to the housing 106 without the additional step of mounting an additional reflector, such as the reflector 130a to the reflector 130b, during package assembly.

Figure 2:
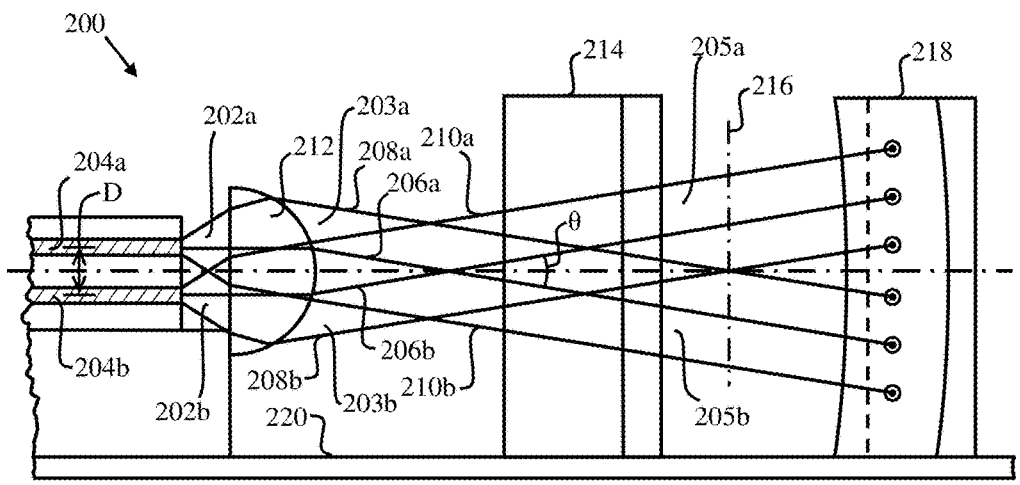
FIG. 2 is a schematic of a side view of another multijunction diode laser apparatus.

FIG. 2 shows a multijunction diode laser apparatus 200 emitting a pair of beams 202a, 202b from a monolithically formed pair of active junctions 204a, 204b. The emitted beams propagate along respective parallel principal axes 206a, 206b and respective marginal axis pairs 208a, 210a and 208b, 210b. Upon emission, the beams 202a, 202b diverge rapidly along a fast axis and are received by a short focal length cylindrical FAC lens 212 which collimates the emitted beams 202a, 202b with respect to a beam fast axis so that corresponding collimated beams 203a, 203b have a pointing difference θ in the fast axis. A cylindrical SAC lens 214 receives the fast axis collimated beams 203a, 203b and collimates the beams along their slow axes to produce fully collimated beams 205a, 205b.

After propagating a selected distance from emitting facets of the active junctions 204a, 204b, to a plane 216, the fully collimated beams 205a, 205b diverge sufficiently with respect to each other so as to be separated. At or after such distance, a cylindrical mirror reflector 218 is disposed so as to reflect the fully collimated beams 205a, 205b at about 90° such that the principal axes 206a, 206b are, as reflected, parallel and parallel to the slow axes of the emitting facets of the active junctions 204a, 204b. The reflected beams are depicted as coming out of the plane of FIG. 2 with enclosed circles at a specular surface of the cylindrical reflector 218. The marginal axes 208, 210 can receive a small amount of focusing effect by reflection by the cylindrical reflector 218. The cylindrical reflector 218 can be positioned to align the reflected beams and secured to a housing surface 220 in the aligned position with a securing material, such as UV-cured epoxy.

Figure 3:
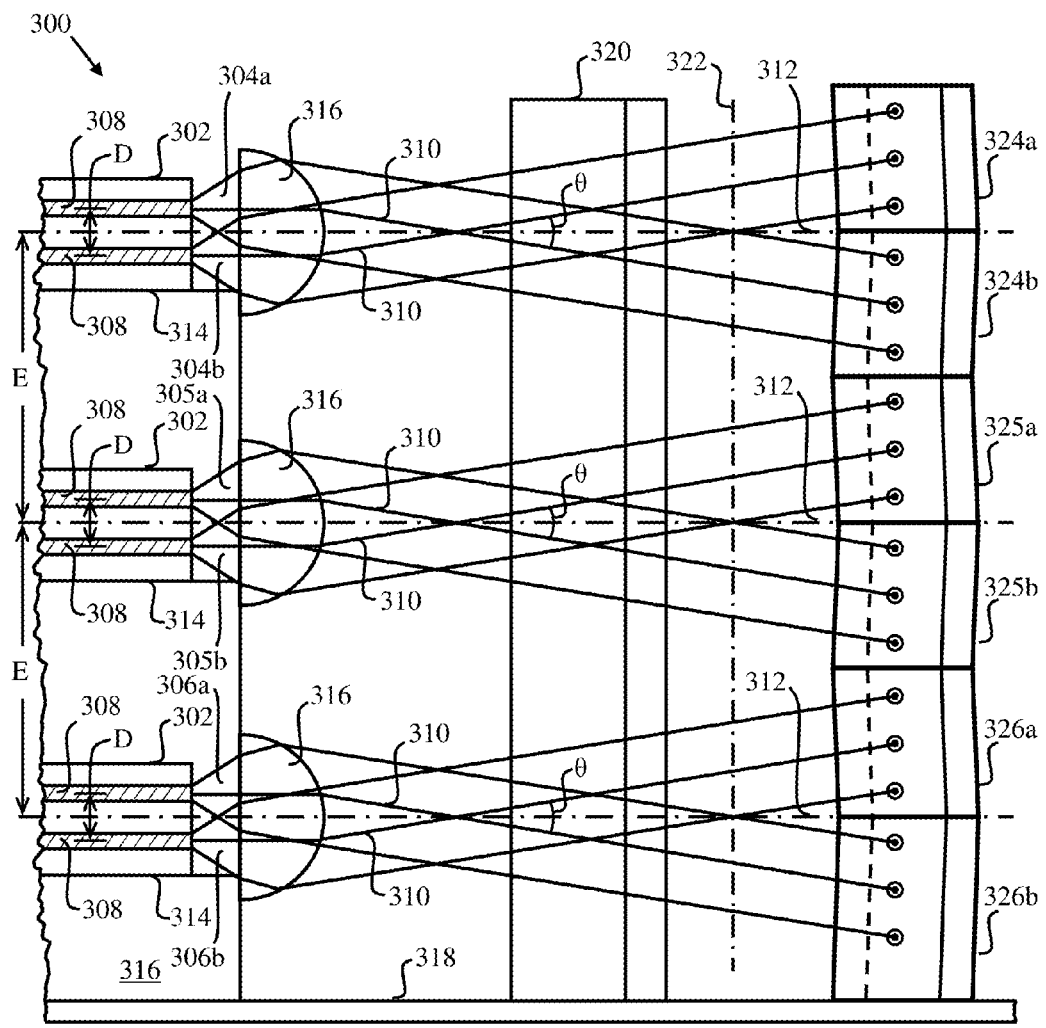
FIG. 3 is a schematic of a side view of another multiple multijunction diode laser apparatus.

In FIG. 3 a multiple multijunction diode laser apparatus 300 includes three multijunction diode lasers 302 each emitting a corresponding pair of beams 304a, 304b, 305a, 305b, 306a, 306b from associated active junctions 308 such that the beams have principal propagation axes 310 parallel to and spaced apart from each other. Each beam principal axis 310 of a pair of beams is offset by a distance D in a semiconductor growth direction generally associated with a growth spacing between corresponding active junctions 308 of the multijunction diode laser which generate the beams. The growth offset D provides a predetermined gap between the emitting facets of the corresponding active junctions of the multijunction diode laser 302. The gap between junctions 308 can be on the order of microns, including less than about 1 μm to 10 μm in some examples.

Each pair of principal axes 310 associated with a multijunction diode laser 302, centered about a central multijunction diode laser axis 312, is spaced apart by a distance E from each pair of principal axes 310 of an adjacent multijunction diode laser 302. The distance E is generally larger than offset distance D between active junctions of a particular diode laser 302. Each multijunction diode laser 302 is mounted to a mounting block surface 314 of a thermally conductive mounting block 316 mounted to a thermally conductive housing 318, with each adjacent mounting block surface 314 being successively higher into the plane of FIG. 3 so as to provide the offset distance E. Each mounting block surface 314 can be provided by a separate mounting block or can be joined together or formed into the same mounting block, as may be convenient. The distance E between adjacent mounting block surfaces can be on the order of 100s of μm. In one example, the distance E is about 450 μm.

Beams 304, 305, 306 diverge rapidly in a fast axis upon emission from corresponding active junctions 308. Each beam pair is received by a corresponding fast axis collimator 316 which collimates the fast axes of each beam of the pair and provides a pointing difference θ between the principal propagation axes 310 of the beams of the pair. Three slow axis collimators 320 are attached to the housing 318 (and spaced apart into the plane of FIG. 3 so that only one is visible) with each situated to receive a corresponding pair of fast axis collimated beams 304, 305, 306. As shown, each slow axis collimator is the same height as each other slow axis collimator. As with other optical components herein, it will be appreciated that heights, focal lengths, and other parameters may be varied to correspond with different package, diode, optical, or other requirements.

At a predetermined distance for each pair of beams, generally denoted with line 322, the power of each beam of the pair will no longer substantially overlap the other beam of the pair. At this position for further along spatially in the direction of propagation, each pair of beams 304, 305, 306 is received by a pair of reflective components 324a, 324b, 325a, 325b, 326a, 326b situated to reflect the incident beams at about a 90° angle such that the principal axes 310 of the reflected beams are about parallel with the longer width dimension associated with the emitting facets of the active junctions 308, i.e., out of the plane of FIG. 3. The principal axes 310 of the reflected beam are also parallel to each other, indicated generally by an encircled point, and therefore no longer include the pointing error θ associated with the offset between active junctions 308 of a particular multijunction diode laser 302.

Figure 4A:
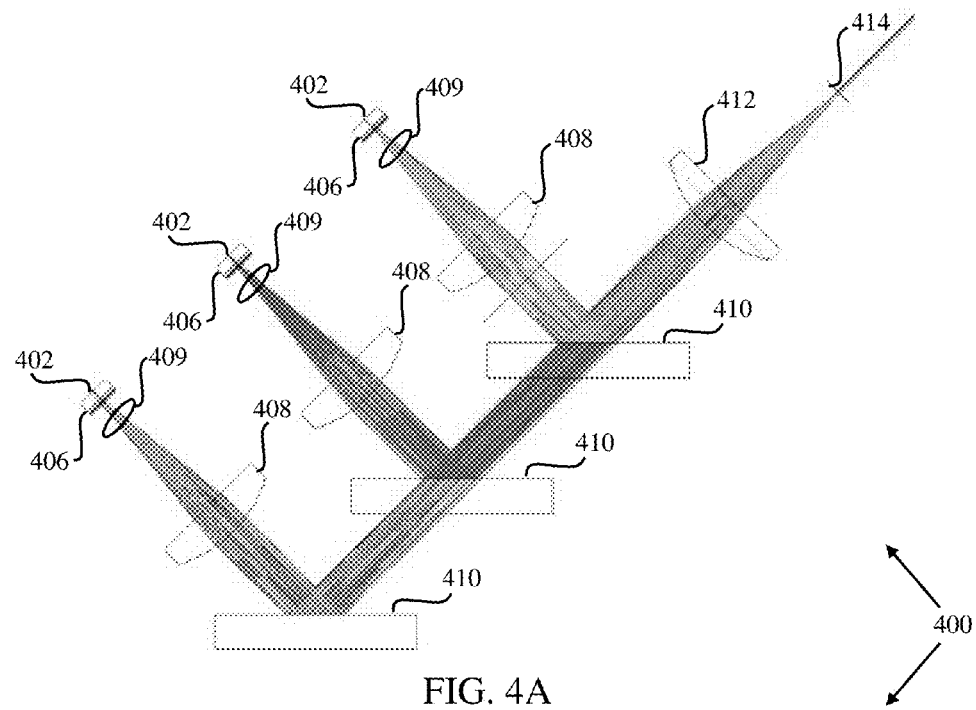
FIG. 4A is a schematic of a top view of a ray trace for a multijunction diode laser apparatus.
Figure 4B:
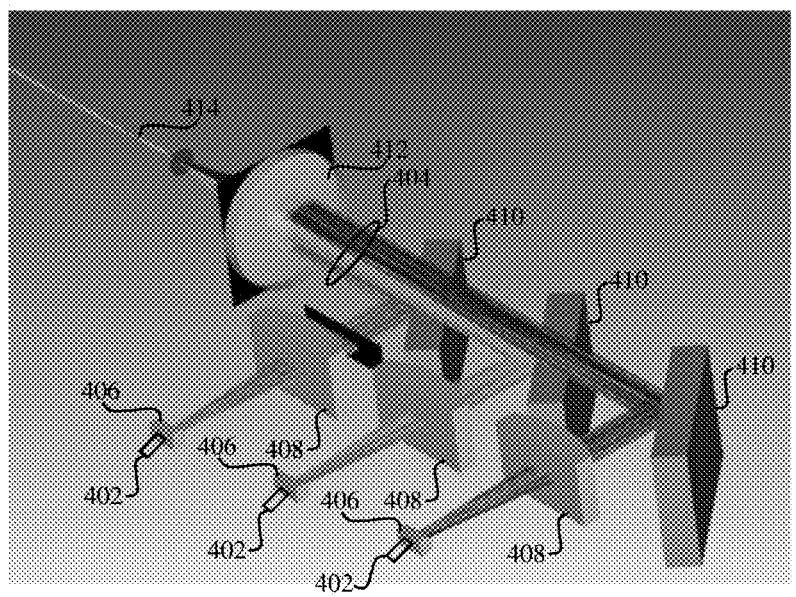
FIG. 4B is a perspective view of the multijunction diode laser apparatus of FIG. 4A.

FIGS. 4A and 4B are a top view and perspective view respectively of an optical ray-trace of a multijunction diode laser apparatus 400 that includes three multijunction diode lasers 402 which are spaced apart from each other vertically and horizontally such that the pairs of diode laser beams 404 associated with each diode laser 402 are emitted in approximately the same plane. Each pair of beams 404 is collimated in the fast axis with fast axis collimators 406 and collimated in the slow axis with slow axis collimators 408. An offset is provided in a growth direction (coming out of the plane of FIG. 4A) of the multijunction diode laser 402 such that each beam 402 of a pair of beams associated with a diode laser 404 has a pointing difference with respect to the other beam in the pair in the fast axes of the beams after propagating through the fast axis collimator 406.

Turning reflectors 410 are each situated to receive a corresponding pair of collimated beams 404 after the collimated beams 404 have diverged sufficiently with respect to each other in the fast axis such that a substantial amount of beam power no longer overlaps. Each turning reflector 410 reflects the corresponding pair of collimated beams 404 perpendicularly or close to perpendicularly into approximately the same plane as the corresponding active regions of the diode laser 402 which emitted the beams and eliminates the pointing difference in the pair of beams 404. In some examples turning mirrors 410 can be compound reflectors which include a planar surface to correspond to each incident beam of the pair of beams 404. In other examples turning mirrors 410 can be mirrors with a large radius of curvature to provide the pointing correction, which is typically less than about 1°. A focusing objective 412 is situated to receive the pointing-corrected beams 404 and to focus the beams into an optical fiber 414.

Figure 8:
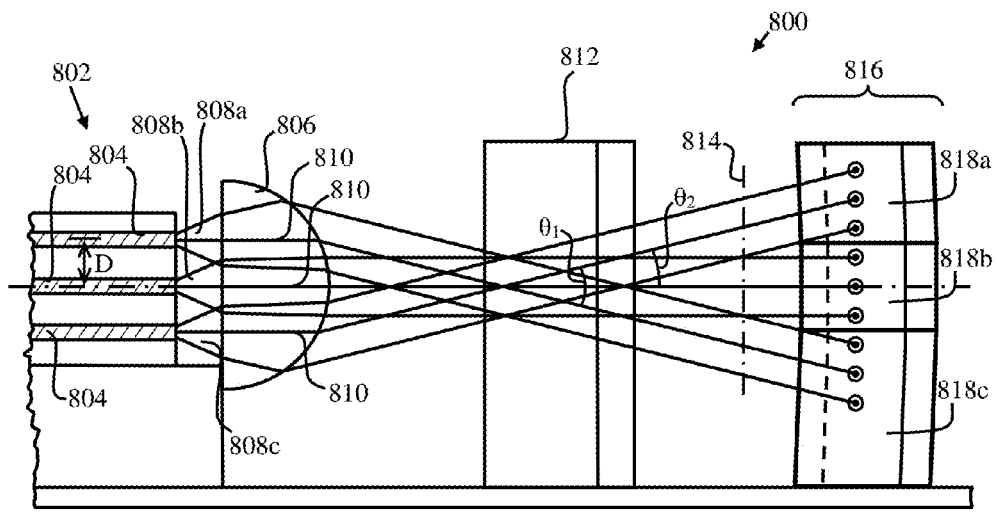
FIG. 8 is a schematic of a side view of another multijunction diode laser apparatus.

A multijunction diode laser apparatus 800 is disclosed in FIG. 8 which includes a multijunction diode laser 802 having three active junctions 804. The three junctions 804 are spaced apart from each other by an offset pitch D which is on the order of a few to several microns. A fast axis collimator 806 is situated adjacent to the emitting facets of the multijunction diode laser 802 and receives the quickly diverging diode laser beams 808a, 808b, 808c emitted from the active junctions 804. Due to the offset and multiple offsets between active junctions, beams 808 coupled into FAC 806 emerge with pointing differences, such as $\theta_1$ and $\theta_2$, between different principal axes 810 of beams 808. A slow axis collimator 812 is disposed in the propagation path of the beams 808 in order to collimate the respective slow axes of the beams 808. At a predetermined distance 814, the fast axis collimated beams 808 propagate such that for each beam 808 a substantial amount beam power associated with a selected beam width no longer overlaps other beams 808. At or after such distance, a reflector 816 is positioned to reflect the incident and spatially separated beams such that the reflected beams 808 have their respective principal axes parallel to each other. As shown in FIG. 8, the reflector 816 includes three planar reflective components 818a, 818b, 818c, each aligned slightly different than the other in order to provide the reflected beams parallel to each other.

Figure 5A:
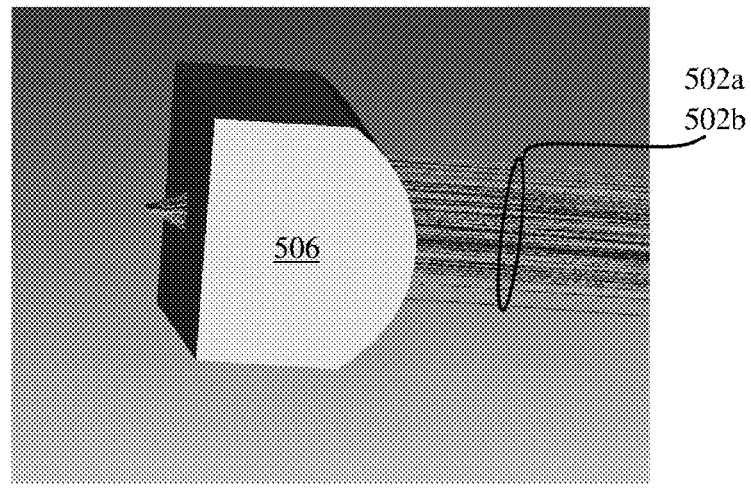
FIG. 5A is a perspective view of a ray trace for a multijunction diode laser optically coupled to a fast axis collimation optic.
Figure 5B:
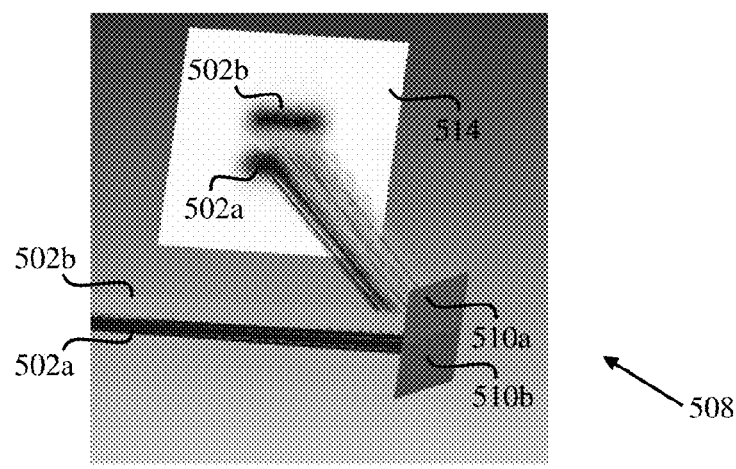
FIG. 5B is a perspective view of a ray trace for a divergent pair of multijunction diode laser beams.
Figure 5C:
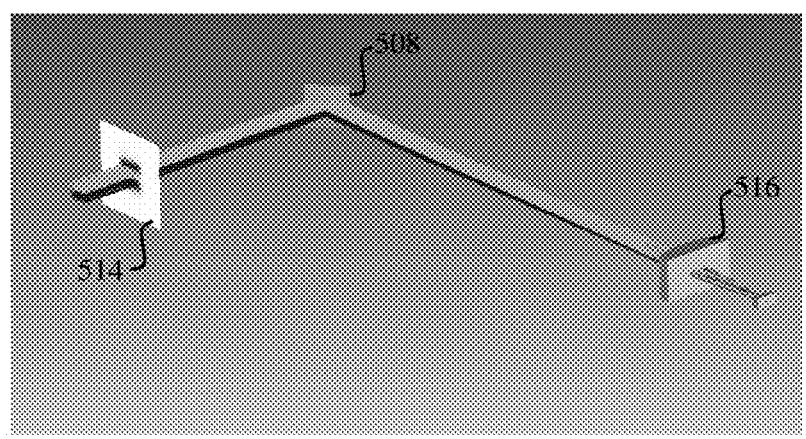
FIG. 5C is a perspective view of a ray trace for the multijunction diode laser and corresponding componentry of FIGS. 5A and 5B.
Figure 6:
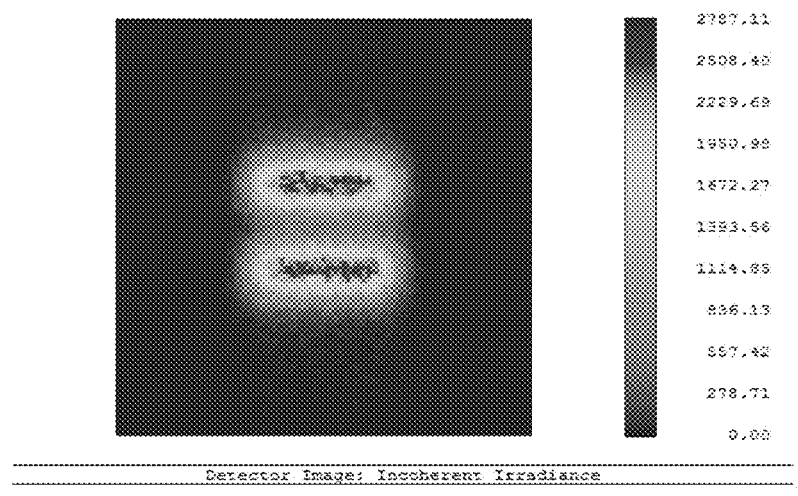
FIG. 6 is an optical intensity profile map for a pair of multijunction diode laser beams.

FIGS. 5A-5C are a ray traces of a multijunction diode laser 500 emitting a pair of beams 502a, 502b which substantially overlap shortly after emission. The emitted beams 502 are rapidly divergent in the fast axis and are received by a plano-convex cylindrical fast axis collimator 506 with a short effective focal length which collimates the beams 502. However, since the beams 502 are emitted from facets of the multijunction diode laser 504 which are offset in the direction of the fast axis, a pointing difference is present in the collimated beams 502 along the fast axis, causing the beams to eventually cross a middle axis between the beams at a predetermined position downstream from the fast axis collimator 506. A turning mirror 508 having lower emitted beam and upper emitted beam planar components 510a, 510b is situated to receive the separated beams and to reflect the beams 502 such that the pointing different between the beams is substantially removed. In some examples, a cylindrical mirror is used as turning mirror 508 in place of a plurality of stacked planar components 510. A single cylindrical mirror can have the added benefit of correcting the principal axes of more than two emitters of a multijunction diode laser. A beam intensity cross-section 514 illustrates the transverse intensity profiles of the beams 502 and the proximity of the reflected parallel beams 502a, 502b. A slow axis collimator 516 is also positioned in the path of the beams 502 in order to collimate the slow axes of the beams. FIG. 6 shows an intensity profile cross-section for a pair of beams emitted from a multijunction diode laser and having propagated about 13 cm from the emitting facets of the laser.

In one example, a diode laser package includes three multijunction diode lasers emitting six beams which are collimated, pointing-corrected, and optically coupled into a 0.135 NA fiber having a 105 µm core diameter. In another example, a diode laser package includes three multijunction diode lasers emitting nine beams (i.e., three emitters per multijunction diode laser) which are collimated, pointing-corrected, and optically coupled into a 0.15 NA fiber having a 105 µm core diameter. In additional examples, polarization multiplexing components are used to double the brightness of the diode laser package. In some examples, a finite distance or offset in the fast axis between emitters of a multijunction diode laser can range from 1 µm or less than 1 µm up to about 10 um and a FAC lens with a short effective focal length, such as between about 150 µm and 400 µm) can be coupled to the emitted beams allowing the propagating optical beams to become spatially separated in the fast axis.

In another example, a multijunction diode laser includes a pair of active junctions offset from each other with a 2 µm pitch center to center in the fast axis and the emitting facet of each active junction includes a 2 µm×75 µm emitting aperture for emitting respective diode laser beams. The beams are collimated to a beam diameter of about 300 µm using a FAC lens with 320 µm effective focal length and a SAC lens with 12 mm effective focal length. Due to propagation through the FAC lens, the propagating beams have a small pointing difference of about 5 mrad. The beams propagate about 25 mm before becoming spatially separated in the fast axis. In another example, two 2 µm aperture emitting facets are spaced apart from each other by 3.6 µm center to center. The beams are collimated with a FAC with an effective focal length of 320 µm, resulting in a pointing difference between emitters of about 0.161° approximately 3 cm from the emitter facets. The separation between the emitters and the focal length of the FAC can both be used to tailor the desired location for positioning one or more turning mirrors situated to reflect the collimated beams and to correct the pointing difference. The SAC is generally positioned before the turning mirror though it can be positioned after in some examples.

Figure 7:
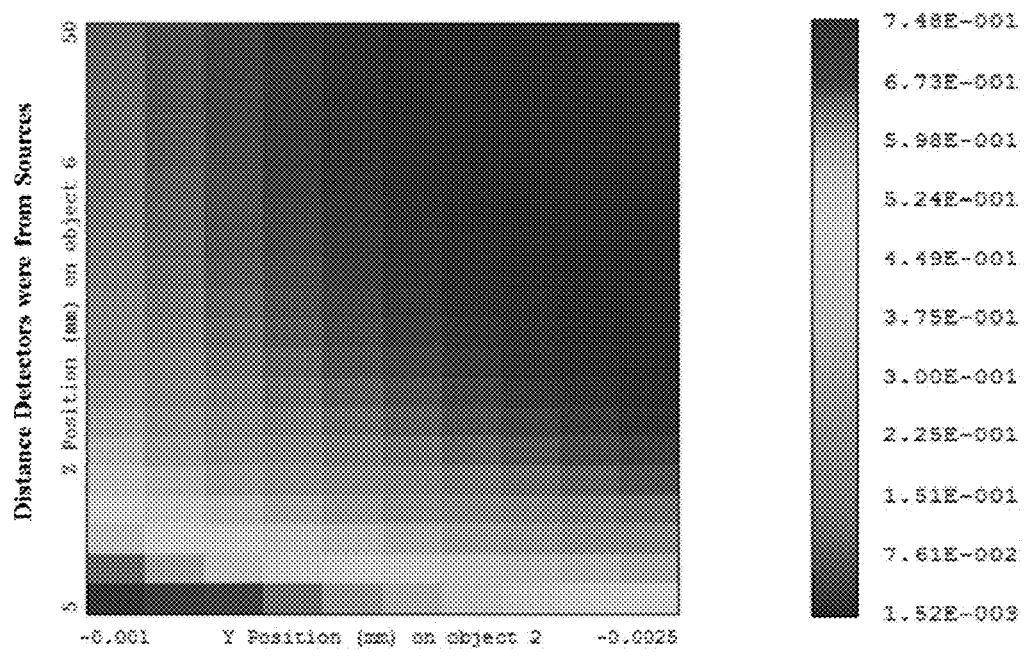
FIG. 7 is a two-dimensional plot of emitter offset and separation distance for multijunction diode lasers.

FIG. 7 is an example of a two-dimensional analysis of a relationship between active junction offset and beam propagation distance where substantial power separation occurs. As can be seen from the chart, turning mirrors can be disposed at different positions to balance brightness, packaging, and other considerations for coupling the beams into an optical fiber, and out of the package housing.

In various examples herein, the output power per diode laser is substantially increased over conventional single-emitter diode lasers since the output power scales with the number of active junctions stacked in the diode laser. Embodiment examples can have increased power while using fewer optics typically associated with such increases. For example, the increased output power can be coupled into an optical fiber using a single FAC and SAC for each multijunction diode instead of with additional FACs and SACs. The increased output power can be provided using a housing similar to a single-emitter configuration effectively resulting in a reduced diode laser package volumetric footprint approximately scaling with the number of active junctions stacked in the multijunction diode lasers.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

I claim:

1. An apparatus, comprising:
at least one multijunction diode laser comprising a plurality of stacked active junctions spaced apart from one another and situated to emit a plurality of beams along respective mutually parallel propagation axes, the beams having associated mutually parallel slow axes and associated collinear fast axes;
a fast axis collimator situated to receive and collimate the plurality of beams along the corresponding fast axes so as to produce corresponding fast axis collimated beams that propagate along associated non-parallel propagation axes; and
a reflector situated to receive the plurality of fast axis collimated beams and to reflect the beams so that the reflected fast axis collimated beams propagate along substantially parallel propagation axes.

2. The apparatus of claim 1, wherein the reflector comprises:
a plurality of planar reflecting components adjoining each other, each planar reflecting component separately angled from each other planar reflecting component and situated so as to receive and reflect an associated fast axis collimated beam so that the reflected fast axis collimated beams propagate along the substantially parallel axes.

3. The apparatus of claim 1, wherein the reflector is a cylindrical mirror.

4. The apparatus of claim 1, wherein the reflector is situated along the non-parallel axes so that the beams are substantially separated.

5. The apparatus of claim 1, further comprising:
a slow axis collimator situated to receive and collimate the plurality of fast axis collimated beams along the corresponding slow axes;
wherein the non-parallel axes divergence associated with the fast axis collimated beams before correction by the reflector is less than about 10 mrad.

6. The apparatus of claim 1, wherein adjacent propagation axes of the emitted beams are offset from each other adjacent beam by between about 2 µm and about 10 µm.

7. The apparatus of claim 1, further comprising a focusing objective situated to receive the reflected fast axis collimated beams and to focus the reflected fast axis collimated beams into an optical fiber.

8. The apparatus of claim 1, further comprising a thermally conductive housing and a thermally conductive mounting block situated in the housing, wherein the at least one multijunction diode laser is mounted to a thermally conductive submount and mounted to a separate mounting surface associated with the mounting block.

9. The apparatus of claim 1, wherein the reflector is situated along the non-parallel axes so that the power overlap of each beam with an adjacent beam is less than about $1/e^2$ of a total beam power of the beam and adjacent beam.

10. A method of directing beams of a multijunction diode laser, comprising:
emitting a plurality of beams from a multijunction laser diode comprising a plurality of stacked active junctions spaced apart from one another and such that principal axes of the emitted beams are parallel, each beam associated with a slow axis that is parallel and spaced apart from slow axes associated with other emitted beams and fast axes associated with the emitted beams are collinear;

collimating each of the plurality of beams along respective fast axes so that the collimated beams propagate at different angles with respect to the parallel principal axes; and reflecting the fast axis collimated beams with a reflector so that the reflected beams propagate along substantially parallel axes.

11. The method of claim 10, further comprising:

positioning the reflector with respect to the collimated beams at a predetermined distance at which the collimated beams are substantially separated.

12. The method of claim 10, further comprising:

collimating the plurality of fast axis collimated beams along the slow axes;

directing the fast and slow axis collimated beams to the reflector; and focusing the reflected beams into a core of an optical fiber.

13. The method of claim 10 wherein the spaced apart slow axes correspond to an active junction offset.

14. An apparatus, comprising:

at least one multijunction semiconductor laser comprising a plurality of stacked active junctions spaced apart from one another and situated on a thermally conductive mounting block, the laser including a plurality of active junctions monolithically stacked one above the other and spaced apart from each other in a semiconductor growth direction along a common injection path, each active junction including a corresponding emitting facet situated to emit a laser beam having with a fast axis and slow axis mutually orthogonal to each other and to a beam emission direction, each beam emission direction being parallel to each other beam emission direction;

a fast axis collimator situated to receive and collimate the beams with respect to the fast axis of the beams and to provide the beams with a pointing difference;

a slow axis collimator situated to receive and collimate the beams with respect to the slow axis of the beams; and a reflective pointing corrector situated to receive the fast axis collimated beams which have propagated at least a distance such that a substantial amount of power of the beams no longer overlaps and situated to reflect the beams such that the principal axes of the reflected beams are parallel to each other.

15. The apparatus of claim 14, wherein the reflective pointing corrector includes a plurality of planar mirrors having corresponding mirror surfaces disposed at pointing corrective angles relative to each other, each planar mirror surface situated to receive a respective fast axis collimated beam.

16. The apparatus of claim 15, wherein one of the planar mirrors is secured to an adjacent planar mirror in an aligned position with epoxy causing the one planar mirror to provide its corresponding reflected beam principal axis parallel to the reflected beam principal axis associated with the adjacent planar mirror.

17. The apparatus of claim 14, wherein the reflective pointing corrector includes a concave cylindrical mirror.

18. The apparatus of claim 14, wherein the laser includes two active junctions.

19. The apparatus of claim 14, wherein the laser includes three active junctions.

20. The apparatus of claim 14, further comprising focusing optics and an optical fiber having a core and cladding, the focusing optics situated to receive the pointing corrected beams and to focus the beams into the core of the optical fiber.

* * * * *